United States Patent [19]

Olson

[11] 4,121,156
[45] Oct. 17, 1978

[54] ROTATING SPINDLE AND STATIONARY TRANSDUCER DEVICE FOR SENSING THE PREFERRED MAGNETICALLY PERMEABLE ORIENTATION IN MAGNETIC MEDIA

[75] Inventor: Arthur Barnhart Olson, Edina, Minn.

[73] Assignee: Control Data Corporation, Minneapolis, Minn.

[21] Appl. No.: 844,330

[22] Filed: Oct. 21, 1977

[51] Int. Cl.² .......................................... G01R 33/12
[52] U.S. Cl. .................................. 324/210; 235/449; 324/239; 360/119
[58] Field of Search ................ 324/210, 212, 226–228, 324/239, 258, 259, 14; 360/21, 119, 121; 235/449, 450, 493

[56] References Cited

U.S. PATENT DOCUMENTS

| 2,914,746 | 11/1959 | James | 235/449 |
| 3,387,377 | 6/1968 | Patton | 324/258 |
| 3,820,012 | 6/1974 | Molyneux | 324/14 |

FOREIGN PATENT DOCUMENTS 1,039,248  9/1958  Fed. Rep. of Germany ........... 360/119

*Primary Examiner*—Robert J. Corcoran
*Attorney, Agent, or Firm*—William J. McGinnis, Jr.

[57] ABSTRACT

A magnetic orientation sensor for magnetic recording media includes a transducer that writes a magnetic pattern on the recording medium and then reads it back. The reading is taken a number of times at a given location but with the magnetic flux traveling in various directions. The strength of the readback signal is used to interpret the magnetic properties of the medium, in particular a direction of orientation which is the preferred or strongest magnetic conductor. The transducer and the medium are stationary with respect to one another at each measurement. The transducer or magnetic head consists of a circular or ring-type structure having a rotating center spindle having a longitudinal bar of magnetic conductive material on the face thereof to create a magnetic field of varying orientation during the writing and reading process. Thus, the coils and most of the mass of the transducer will remain stationary while only a small portion of the mass, consisting of the spindle, rotates to cause a continual reorientation of the magnetic path through the recording medium.

2 Claims, 8 Drawing Figures

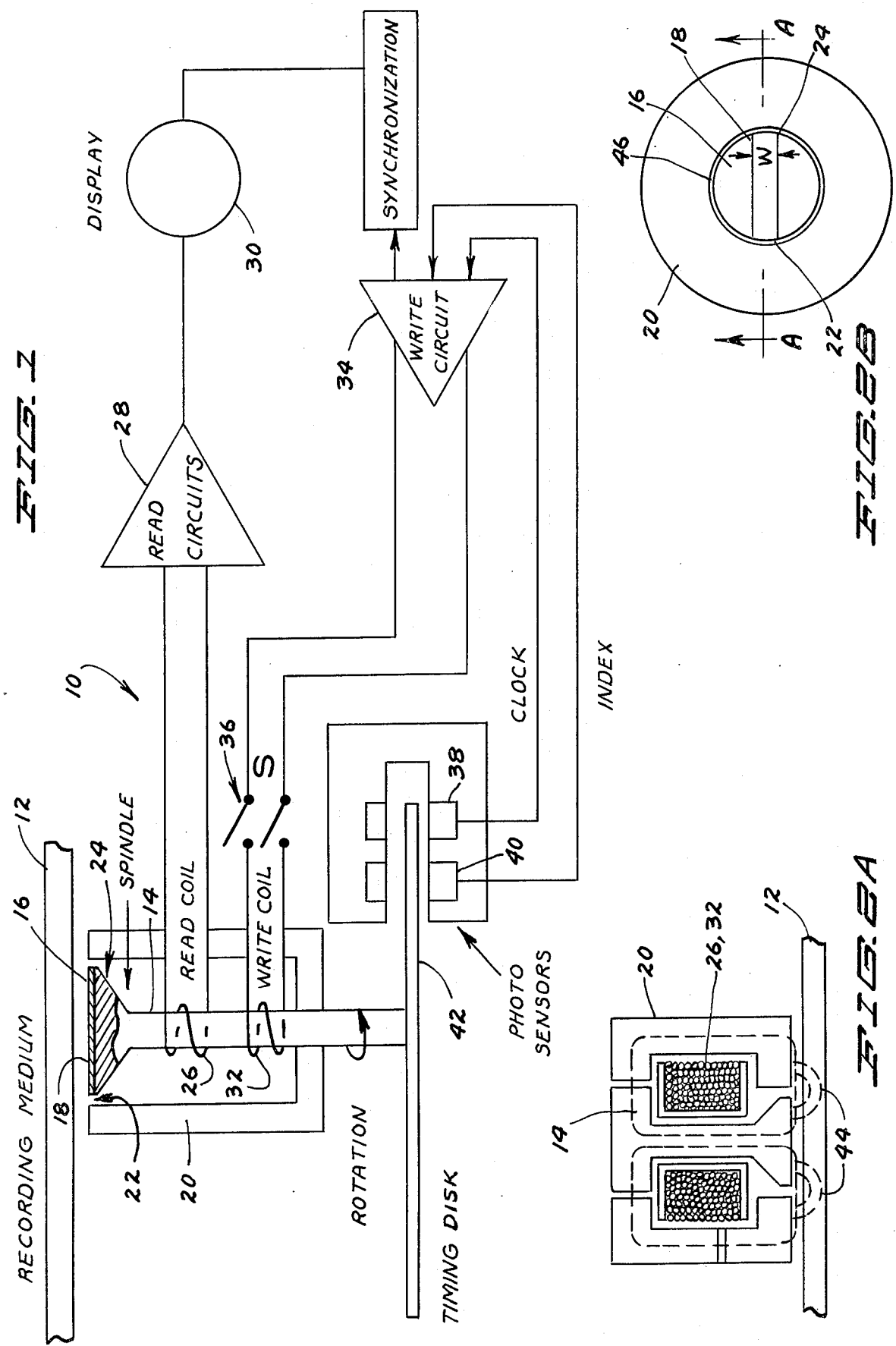

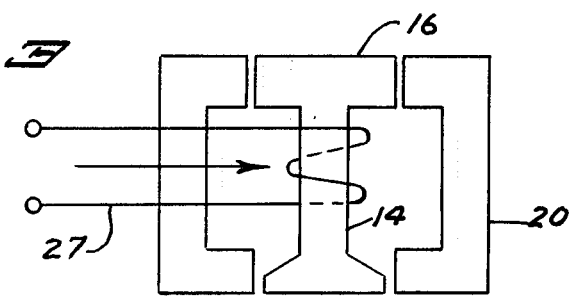
FIG. 3
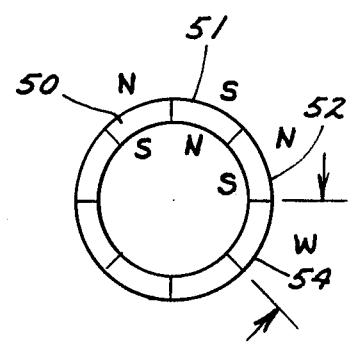
FIG. 4A
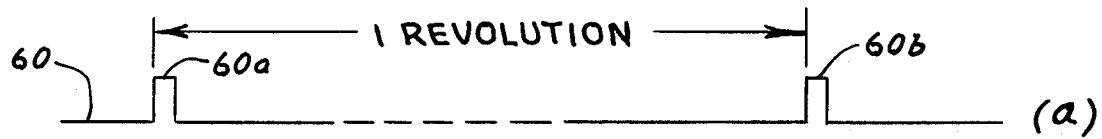
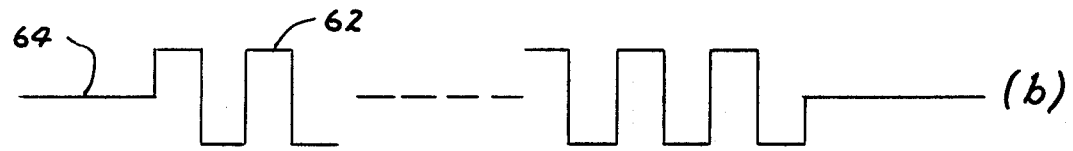
FIG. 4B
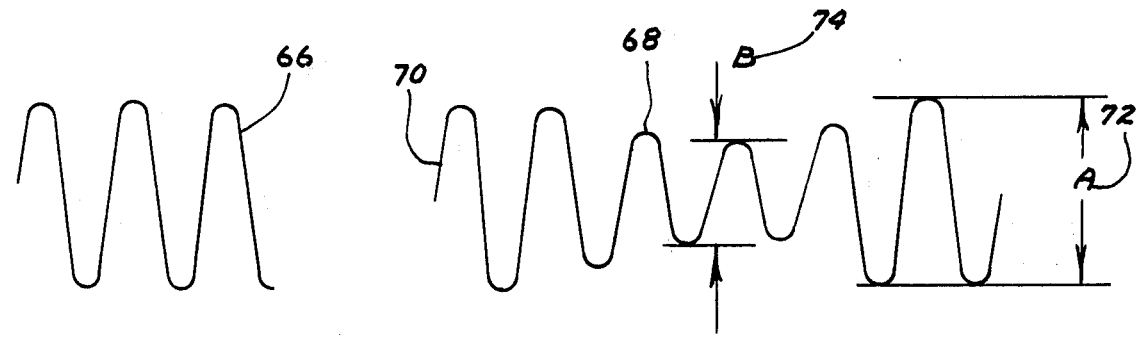
FIG. 5A
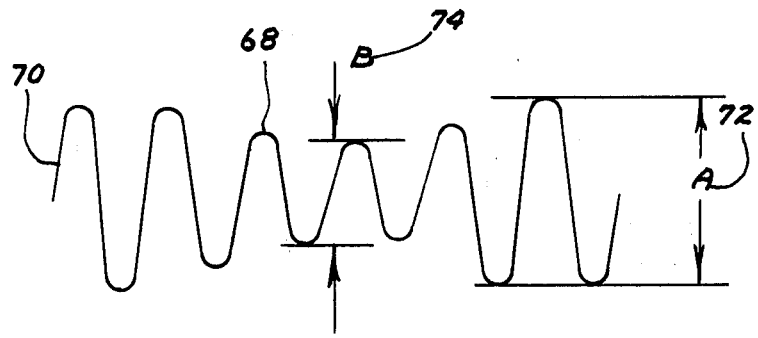
FIG. 5B

ROTATING SPINDLE AND STATIONARY TRANSDUCER DEVICE FOR SENSING THE PREFERRED MAGNETICALLY PERMEABLE ORIENTATION IN MAGNETIC MEDIA

BACKGROUND OF THE INVENTION

This invention relates to a device for testing the preferred or strongest magnetic orientation in a recording surface. More particularly, this invention relates to a circular or ring-type magnetic transducer having a rotating spindle where the spindle carried an element of magnetic material longitudinally oriented on the face thereof so that the transducer presents to the recording medium being tested a continually varying orientation.

In manufacturing magnetic recording material, certain production processes have been found to produce a recording medium with a preferred magnetic orientation where the medium is most responsive to recording signals and easiest to read. It is desirable in recording media to have the preferred magnetic orientation be in a direction favorable for reading and writing based on the direction of movement of material relative to the recording and reading transducer as well as least favorable for interference between recorded materials which are closely positioned to one another but should not cause interference. One such type of material is a magnetic disk of the type used in data processing equipment. Such a disk contains numerous tracks for recording data which are arranged radially on the disk and each track is concentric with all the others. The disk rotates with respect to the transducing head and so the preferred orientation for reading and writing should be with the rotational direction of the recording media while adjacent concentric tracks radially located from each other should be against the preferred orientation of the media so that interference is minimized.

Thus, in the manufacture of disk packs for data processing equipment, various testing procedures are necessary to spot test processes used for placing the magnetic media on the disks to insure that the processing is producing the desired results. Typical prior art testing techniques required completion of a disk device and testing by actual recording and reading of the disk and comparison with a standard result obtained with the process. Thus, no actual measurement of the disk magnetic orientation was possible during manufacture but rather a testing of the performance of the disk after manufacture. It is, therefore, desirable to provide a method and device which may be used to actually detect the preferred magnetic orientation of a recording medium.

SUMMARY OF THE INVENTION

The present invention consists of a transducer having a circular face designed to be placed adjacent to and parallel with the recording medium to be tested. The transducer will have a spindle in the center of the face with an appropriate gap distance between the spindle and the stationary outer ring of the transducer. The face of the spindle will contain a longitudinal bar or element of magnetic material which will serve as a magnetic flux conductor between the stationary ring of the transducer and air gaps at either end of the element of magnetic material.

The spindle is continuously rotated while write signals are applied to the transducer and the output of the read coil is measured. Where the magnetic medium provides the greatest flux conduction, indicating its preferred magnetic orientation, the read signals from the output will be the strongest.

In the Figures:

FIG. 1 is an side elevational diagrammatic view of an orientation sensor according to the present invention;

FIG. 2A is a cross section of a transducer according to the present invention;

FIG. 2B is a plan view of the face of a transducer according to the present invention;

FIG. 3 is a diagrammatic representation of a device according to the present invention;

FIG. 4A is a diagram of the magnetic field induced by a device according to the present invention;

FIG. 4B is a chart of the wave forms used in the present invention;

FIG. 5A is a wave form of the read signals produced during operation of the present invention; and FIG. 5B is a wave form diagram of read signals obtained during operation of an embodiment of the present invention.

DESCRIPTION OF THE PREFERRED EMBODIMENT

Referring now to FIG. 1, a device 10 according to the present invention is shown in simplified diagrammatic form. A recording medium 12 such as a disk is schematically represented by a fragment and not necessarily in size proportion. A rotating spindle 4 is positioned adjacent to the recording medium and formed with a rotating face 16 which is properly positioned a very small distance from the recording medium to create an air gap proportional to the conventional recording gap. The face 16 of spindle 14 contains a longitudinal bar of magnetic material 18 which is shown here in cross section and shown better in other figures. A ring-type structure 20 of magnetic material formed about the spindle completes a magnetic flux path between one end of the rotating drive shaft of the spindle 14 and the face portion 16 so that a gap 22 is formed near the recording surface and a second gap 24 is created at the opposite end of the spindle with respect to the londitudinal magnetic piece 16.

With respect to the ring-type structure 20 and the face of the spindle 16, there is a continuous, circumferential gap. However, for the magnetic path formed by the magnetic pole piece 18, it appears to the recording medium 12 as if there is a single recording head with two gaps displaced from one another. A read coil 26 surrounds the spindle 14 and is connected with conventional amplification and read circuits 28. The output of the read circuitry 28 may be connected with an appropriate display 30, such as an oscilloscope. A write coil 32 also is formed about the shaft 14 of the spindle and switchably connected with write circuits 34. Switch 36 is shown as implementing the switching function. The write circuits 34 are connected with photosensors 38 and 40 which are positioned relative to a timing disk 42 on the opposite end of spindle 14 from the face 16. Photosensing devices 38 and 40 provide index and clock signals to the write signals to control the signals operating in the write coil 32. Furthermore, the timing disk 32 has a known orientation with respect to the magnetic material 18 in the face 16 of the spindle. Photosensor 40 may correspond to a very deep notch cut in the timing wheel 42 which may be read at every revolution. Photosensing device 38 may be placed further outwardly on the radial timing disk 42 so that only shallower index notches are read periodically during rotation of the timing disk with spindle 14 so that periodic pulses are generated in the write coil 32.

FIG. 2A shows in cross section a more detailed view of spindle 14, structure 20, recording medium 12 and coils 26 and 32. Flux paths 44 show the way in which flux feeds the transducer and travels through the magnetic material 12 in order to obtain an indication of the qualities of the magnetic material.

Referring now to FIG. 2B, section lines A—A show the cross-sectional view which is representative of the drawing of FIG. 2A. Face 16 of the spindle is shown together with a circumferential gap 46 which exists with respect to the ring-type structure 20. Note, however, that because of longitudinal pole piece 18 only two gaps 22 and 24 exist for a conventional magnetically conductive path, while the remainder of the face 16 of the spindle 14 is magnetically nonconductive.

Referring now to FIG. 3, the same elements are shown as in FIG. 2 except that only a single coil 27 is shown schematically. FIG. 4A shows the sort of pattern that would be generated in magnetic material as the pole piece 18 is rotated on the face of rotating spindle 14 while current is pulsed in the drive coils. The timing indexes sensed by sensor 38, as shown in FIG. 1, caused periodic reversals in the drive current in the write coils of the transducer which is represented in FIG. 4A by various reversals of north and south poles generated in the magnetic material. These north and south poles are indicated schematically at 50, 51 and 52 and so forth in the figure, each of the regions being spaced apart slightly larger than the width of the pole piece 18. This width is schematically indicated at 54 in FIGS. 2B and 4A as W.

Referring now to FIG. 4B, for each revolution of the spindle 14, as indicated by index marks generated by sensor 40 and reproduced schematically at wave form 60, a plurality of pulses of drive current 62 will be generated in the write coil 32 as shown schematically by wave form 64.

Referring now to FIG. 5A, if the magnetic medium 12 has the same magnetic properties in all orientations, a wave form such as 66 having a generally constant amplitude will be read or sensed by read coil 26 and presented on display 30. However, if the magnetic material 12 has a preferred magnetic orientation where the material is comparatively nonconductive magnetically, a region 68 will be shown in wave form 70 of decreased amplitude, all as indicated in FIG. 5B. The normal or conventional amplitude for an unoriented or standard oriented magnetic medium is shown by A at 72 while a decreased amplitude is shown at B by reference numeral 74 indicating a region where magnetic conductivity is lowered. Because of the index marks occurring with each revolution as shown at 60A and 60B in wave form 64B the display may be synchronized to show the exact direction of preferred magnetic orientation with respect to the portion of the rotating cycle at which the decreased amplitude B is shown.

What is claimed is:

1. A magnetic orientation sensor for magnetic recording media comprising:
   a transducer consisting of a cylindrical structure having a generally circular shaped planar face perpendicular to the cylindrical axis said cylindrical structure having an axial, longitudinal central opening,
   a rotatable spindle mounted in the central opening of said transducer, said spindle having a head portion having a generally flat face co-planar with the face of said cylinder,
   a longitudinal element of magnetic material mounted in the face of the head portion of said spindle, extending from one edge of the face to the other and forming a pair of flux gaps with said transducer, and
   at least one coil magnetically coupled to said spindle and within said transducer for applying drive signals and for receiving signals induced
   said sensor, in operation, being disposed with the faces of said cylinder and said spindle in a parallel plane and proximate to a sample of essentially planar recording media.

2. The structure of claim 1 and further comprising:
   timing means mounted on said spindle for rotation and having index means thereon for providing a reference with respect to the rotation of said spindle,
   sense means operatively associated with said timing means and including a sensing device mounted in a stationary relationship and proximate to the index means for producing control signals in response to said index means as said spindle rotates, and
   means connected with said sense means to control the reading and writing of signals on a magnetic medium associated with said transducer in response to the rotational orientation of said spindle, and
   measurement means to compare signals read from said magnetic medium at various rotational orientations of said spindle.

* * * * *